(12) United States Patent
Rainish

(10) Patent No.: US 10,014,929 B2
(45) Date of Patent: Jul. 3, 2018

(54) METHOD FOR UTILIZING AVAILABLE RESOURCES IN A COMMUNICATIONS NETWORK

(71) Applicant: Satixfy Israel Ltd., Rehovot (IL)

(72) Inventor: Doron Rainish, Ramat Gan (IL)

(73) Assignee: SATIXFY ISRAEL LTD., Rehovot (IL)

( * ) Notice: Subject to any disclaimer, the term of this patent is extended or adjusted under 35 U.S.C. 154(b) by 0 days.

(21) Appl. No.: 15/311,960

(22) PCT Filed: May 13, 2015

(86) PCT No.: PCT/IL2015/000024
§ 371 (c)(1),
(2) Date: Nov. 17, 2016

(87) PCT Pub. No.: WO2015/177778
PCT Pub. Date: Nov. 26, 2015

(65) Prior Publication Data
US 2017/0126311 A1    May 4, 2017

Related U.S. Application Data

(60) Provisional application No. 62/000,529, filed on May 20, 2014.

(51) Int. Cl.
| | | |
|---|---|---|
| *H04H 20/71* | (2008.01) | |
| *H04H 20/74* | (2008.01) | |
| *H04H 60/09* | (2008.01) | |
| *H04H 40/00* | (2009.01) | |
| *H04B 7/185* | (2006.01) | |
| *H04W 4/02* | (2018.01) | |
| *H04W 72/12* | (2009.01) | |
| *H04W 40/00* | (2009.01) | |

(52) U.S. Cl.
CPC ..... *H04B 7/18539* (2013.01); *H04B 7/18513* (2013.01); *H04W 4/023* (2013.01); *H04W 40/005* (2013.01); *H04W 72/121* (2013.01)

(58) Field of Classification Search
CPC .................................................. H04B 7/18539
USPC ............................ 455/3.02, 3.01, 3.06, 3.05
See application file for complete search history.

(56) References Cited

U.S. PATENT DOCUMENTS

| | | | |
|---|---|---|---|
| 8,432,797 B2 * | 4/2013 | Fonseca, Jr. .......... | H04L 47/805 370/230 |
| 8,478,189 B2 | 7/2013 | Liu et al. | |
| 8,478,262 B2 * | 7/2013 | Sun ................... | H04W 36/0088 455/423 |
| 8,804,689 B2 * | 8/2014 | Madan .................. | H04W 28/26 370/235 |

(Continued)

*Primary Examiner* — Tilahun B Gesesse
(74) *Attorney, Agent, or Firm* — Browdy and Neimark, PLLC

(57) ABSTRACT

A method is described for use in a satellite communication network, utilizing available resources (e.g. when operating in an idle mode) of at least one first terminal. that belongs to a cluster comprising a plurality of terminals that are adapted to communicate with a satellite, by at least one other terminal being a second terminal that belongs to that cluster of terminals, and wherein the utilization of idle resources is done by enabling communications between the first and second terminals is carried out by using a communication link that is not part of the satellite communication network.

3 Claims, 1 Drawing Sheet

(56) References Cited

U.S. PATENT DOCUMENTS

| | | | |
|---|---|---|---|
| 9,635,542 B2* | 4/2017 | Uhari | H04W 8/183 |
| 2002/0034190 A1 | 3/2002 | Baratz Yaron et al. | |
| 2005/0192031 A1* | 9/2005 | Vare | H04W 36/32 |
| | | | 455/456.6 |
| 2006/0036520 A1 | 2/2006 | O'Neill | |
| 2010/0009695 A1 | 1/2010 | Kwon et al. | |
| 2010/0167719 A1 | 7/2010 | Sun et al. | |
| 2010/0227620 A1* | 9/2010 | Naden | H04B 7/2606 |
| | | | 455/445 |
| 2011/0235592 A1* | 9/2011 | Hoefel | H04L 67/42 |
| | | | 370/329 |
| 2012/0202416 A1* | 8/2012 | Naden | H04B 7/2606 |
| | | | 455/7 |
| 2013/0247034 A1 | 9/2013 | Messerli | |
| 2013/0308549 A1 | 11/2013 | Madan et al. | |
| 2014/0094183 A1 | 4/2014 | Gao et al. | |
| 2017/0013656 A1* | 1/2017 | Van Phan | H04W 8/005 |

* cited by examiner

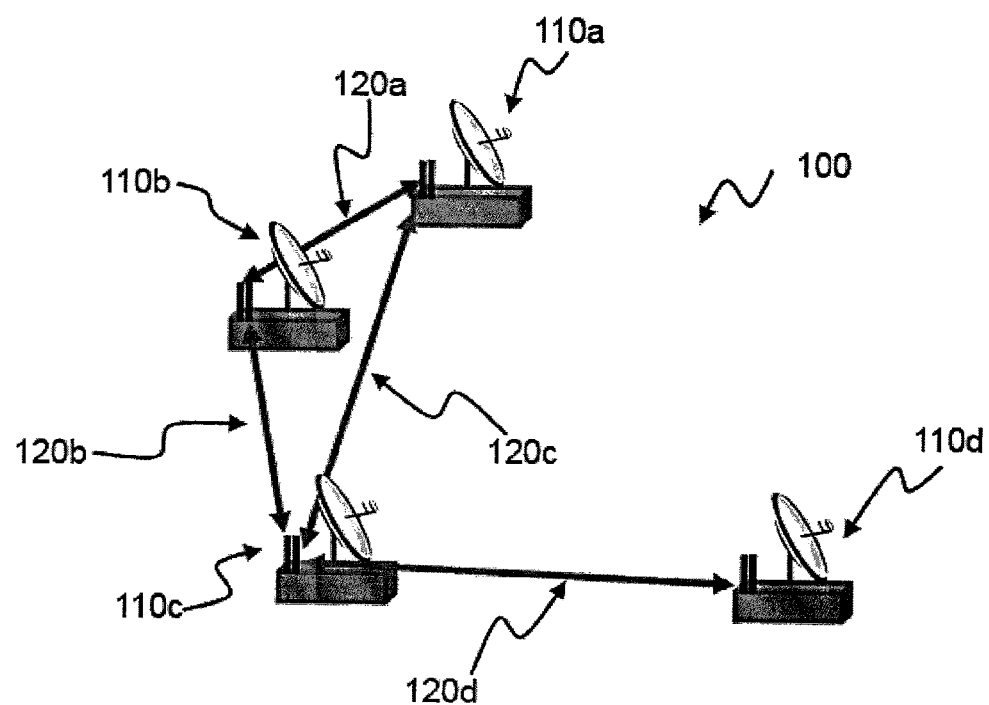

METHOD FOR UTILIZING AVAILABLE RESOURCES IN A COMMUNICATIONS NETWORK

FIELD OF THE DISCLOSURE

The present disclosure generally relates to the field of communications and more particularly, to methods for sharing available resources between units connected via a communication link.

BACKGROUND OF THE DISCLOSURE

The demand for higher communication throughput as well as lower communication terminal cost is constantly increasing. This increase goes hand in hand with a dramatic increase in the number of terminals (e.g. mobile terminals) that are connected to communication networks as well as an increase in the number of different communication channels that are available within a single terminal (for example, a typical smartphone has at least cellular+WiFi+BlueTooth capabilities). However, many of these terminals, or at least part of their communication channels, are idle for a major part of the time.

The idea of utilizing idle resources, and particularly in cellular networks, has been the subject of many solutions proposed in the art. To name but few, US 20100009695 describes a wireless communication system, where a base station lends an idle resource to another base station, for the latter to use the borrowed idle resource in order to perform data transmission.

U.S. Pat. No. 8,478,189 discloses a relay communication system in which a relay station notifies the idle resources which a transmitting terminal required and both the transmitting terminal transmits the data to the relay station on the idle recourse, and the relay station retransmits the data to the receiving terminal on the idle resources.

US20020034190A describes a method for managing communications in a cellular network and an activity server predicts a forthcoming time interval during which sufficient network resources will be available to allow a predetermined message to be sent to users of the network. When the time interval arrives, the activity server initiates the sending of the message, and the users are then able to receive the message.

Still, it would be beneficial to find a method that enables improving utilization of existing network resources, thereby enabling reduction of the CAPEX involved in adapting the communication networks to the ever-growing demands for resources.

SUMMARY OF THE DISCLOSURE

At any given time, there is a high probability that quite a few terminals are located within a close proximity from each other (a fact that leads to their ability to communicate with each other, typically at high speed), while quite a few of them have at that given time at least some spare resources (HW, SW, memory, battery, etc.) available (e.g. when they are in an idle mode). Under these conditions, the solution proposed by the present invention enables these terminals to decide between themselves, or with the help of a central entity (e.g. a network managing entity), how to better utilize available resources to the benefit of all or some of the terminals located within that proximity.

Examples for possible types of such terminals are cellular phones, tablets, laptops, desktop computers, smart television sets and the like. Such terminals may be connected for example to a satellite network, a cable network and/or a heterogeneous networks (HetNets).

Some of the benefits that may be gained from such a collaboration are: better performance (communications or carrying out other tasks that the terminal may need otherwise to carry out by itself) and lower terminal costs, e.g. by reducing the resources that need to be provided to each individual terminal.

Battery charge for example may be shared by shifting power consuming tasks from one terminal to another terminal, currently having a higher battery charge, or even to one that is currently connected to a power line.

Thus, a cluster of terminals may share resources in order to increase overall system throughput and thus reduce overall system and terminal cost.

Therefore, according to the present invention there is provided a method for use in a communication network, utilizing available (e.g. while being in an idle mode) resources of at least one first terminal that belongs to a cluster comprising a plurality of terminals that belong to that communication network, by at least one other terminal, being a second terminal, that belongs to the cluster of terminals, and wherein the utilization of the available resources is done by enabling communications between the at least one first and at least one second terminals to be carried out while using a communication link that is not part of the communication network.

According to another embodiment, the communication link is selected from a group that consists of: a link in a wired communications network, a link in a wireless communications network and a link in an optical communications network, and the like.

By yet another embodiment, the method provided comprises the steps of:
1) identifying terminals that belong to said cluster which are able to communicate with said at least one second terminal;
2) selecting at least one terminal from among the identified terminals, being at least one first terminal, whose available (e.g. while being in an idle mode) resources may be utilized by said at least one second terminal; and
3) determining resources of the at least one first terminal that are currently available (e.g. while being in an idle mode) resources, that may be utilized by the at least one second terminal.

In accordance with still another embodiment, step 3 further comprises inquiring (e.g. by the at least one second terminal) whether specific resources of the at least one first terminal may be utilized by the at least one second terminal.

According to another embodiment, the above step 3 further comprises determining characteristics of data to be conveyed from the at least one second terminal to the at least one first terminal.

By still another embodiment, the characteristics of the data comprises as least one of the following characteristics:
a. Quantization of the data;
b. Compression of the data;
c. Error correction coding;
d. Modulation of the data; and
e. Transmission of descriptors of the data.

In accordance with another embodiment, the terminals that are associated with the cluster of terminals, belong to a at least one network being a member of the group that consists of: a satellite communication network, a high altitude, long endurance (HALE) unmanned aircraft communication network, a cable network and a heterogeneous network (HetNet). Preferably, the cluster of terminals comprises a plurality of satellite terminals and the communication network is a satellite communication network.

By yet another embodiment, the terminals associated with the cluster of terminals are members of the group that consists of: Very Small Aperture satellite Terminals (VSAT), set top boxes used in satellite communication networks, set top boxes used in cables communication network, cellular phones, tablets, laptops, desktop computers, and smart television sets, and the like.

In accordance with another embodiment, at least two of the plurality of terminals belonging to the cluster of terminals, belong to two or more different types of terminals. For example, a cellular phone and a smart TV that are associated with a home network.

According to still another embodiment, step 3 further comprises determining at least one of the following:
(i) resources of the at least one first terminal that will be utilized by the at least one second terminal; and
(ii) data that will be exchanged via the communication link(s) extending between the selected first terminal(s) and the at least one second terminal.

By still another embodiment, the resource of the at least one first terminal that may be utilized by the at least one second terminal at times that it is not used by its respective at least one first terminal, is a member of a group that consists of: power, display and user interface resources, and computational resources, and the like.

According to another embodiment, the at least one second terminal is configured to aggregate information received from one or more other first terminals belonging to the cluster of terminals, while using at least one communication link (e.g. at least one secondary channel) that is not part of the communication network.

By yet another embodiment, the information to be aggregated is received from one or more first terminals at times when these one or more first terminals are in an idle mode.

In accordance with another embodiment, the aggregated information comprises information received by a plurality of terminals belonging to the cluster of terminals, while communicating with a satellite.

According to still another embodiment the aggregated information is FEC input LLRs, and wherein the at least one second terminal is configured to add LLRs from at least one of the one or more first terminals, that correspond to its bit or symbol.

In accordance with still another embodiment, the aggregated information is FEC output LLRs, and wherein the at least one second terminal is configured to add LLRs from at least one of the one or more first terminals, that correspond to its bit or symbol.

BRIEF DESCRIPTION OF THE DRAWING

The present invention will be more fully understood from the following detailed description of the embodiments thereof, taken together with the drawing which:

FIG. 1 illustrates a cluster of satellite communication terminals interconnected via a secondary communication links

DETAILED DESCRIPTION OF THE DISCLOSURE

The solution provided by the present invention, enables sharing available (e.g. while being in an idle mode) resources associated with a plurality of terminals that belong to a cluster of terminals. According to the solution provided, at least two of the terminals belonging to this cluster are interconnected with each other by a communication link, which is not part of the communication network to which they belong, thereby enabling the enhancement of the system and terminal performance, as well as allowing reduction of system and terminal costs.

FIG. 1 illustrates an exemplified system that implements an embodiment of the present invention. The system exemplified in this example may be characterized by having the following components:

Communication Links:

The communication links (120a, 120b, 120c, 120d), which are not part of the satellite communications network, interconnect the at least two of the terminals (110a, 110b, 110c and 110d) which are included in the cluster of terminals, may be of any one of several types such as wired, wireless (e.g. Wi-Fi, BlueTooth, cellular, etc.), optical, etc. It should be noted that: a) not all the interconnecting links within a single cluster should be of the same type, and b) not all the terminals need to be connected to each of the other terminals belonging to that cluster.

Collaboration Agreement:

Before the actual sharing of resources takes place between various terminals belonging to a single cluster (where such sharing is referred to hereinafter as "collaboration"), preferably some or all of the following steps are carried out for a given terminal (being a second terminal)
1) Mapping the other terminals that belong to the cluster which are able to communicate with the given terminal,
2) Selecting at least one first terminal from among the mapped terminals for collaboration with the second terminal,
3) Determining (e.g. mutually agreeing upon) the type of collaboration that will be affected between the second terminal and the at least one first terminal, (optionally or in addition this step may be conducted simultaneously with a number of the mapped terminals).

Step 3 described above, may further comprise determining at least one of the following:
a. The resources of the first terminal(s) that will be utilized by the second terminal (which would otherwise be unused (idle, not fully used, etc.) at the first terminal(s)); and
b. Data that will be exchanged via the communication link(s) extending between the second terminal and the selected first terminal(s). Among the examples of resources of the second terminal that may be utilized by the second terminal, there are:
(i) Power. This resource may be utilized by transferring high power consuming tasks (e.g. data processing) to first terminals wherein more energy is currently available than energy which is currently consumed by the first terminal(s) itself/themselves (e.g. having loaded batteries or connected to main power, etc.). In other words, when the first terminal carries out one or more high power consuming tasks transferred to it from the second terminal, the second terminal is in fact utilizing the power resource of the first terminal.
(ii) Display and user interface resources. These resources may include for example enabling the second terminal to use a member of the group that consists of a screen, a speaker, a microphone, a camera, a keyboard and the like that belongs to a respective first terminal. For example, by routing signals/data from the second terminal to the first terminal(s) after determining the resource required by the second terminal and confirming their availability at the first terminal(s), and carrying out the collaboration determination step (step 3 referred to hereinbefore).

(iii) Computational resources. These resources may include carrying out certain functionalities that require extensive computational resources such as management and control functionalities, data processing functionalities etc.

Data that will be diverted from the second terminal to the at least one first terminal, may be characterized by all or some of the following characteristics:

a. Quantization of the data;
b. Compression of the data;
c. Error correction coding;
d. Modulation of the data;
e. Transmission of descriptors of the data; and
f. The reverse operations for characteristics a to e;

As will be appreciated by those skilled in the art, it could be that the main communication protocol used by the second terminal and the at least one first terminal might need to be modified in order to facilitate the resource sharing between themselves. For example, a robust header, comprising information on the destination terminal and on the payload type, would allow demodulation and decoding resource sharing even if the message itself cannot be detected by any single terminal.

According to another embodiment, when the terminals' cluster is a cluster of satellite communication terminals, (e.g. as illustrated for example in FIG. 1), then the resources that may be shared include antenna and demodulation resources.

By another embodiment, the resources that may be shared are any one or more of the resources associated with the terminal's receiver, namely, antenna, down converters, filtering amplification, analog to digital conversion, filtering, frequency acquisition and tracking, timing acquisition and tracking, equalization, header extraction, frame demultiplexing, logarithm of the likelihood ratio ("LLR") calculation, FEC decoding (with soft or hard output).

The data being diverted to the other terminal(s) may include quantization, compression, modulation and transmission of preferably the FEC input LLRs or the FEC output (soft) LLRs.

By still another embodiment, the second terminal (i.e. the target terminal) is configured to aggregate information received from other terminals that belong to its cluster (collaborating members) from the satellite they are all associated with. For example, let us assume that a terminal (being a second terminal) in a satellite communication network has not properly received one or more messages from the current satellite. That second terminal may approach other terminals (first terminals) located in its vicinity (which belong to its cluster) by a communication link that is not part of the communication network (e.g. an optical link), requesting the first terminal(s) to convey via that latter communication link, all (or parts) of messages that were destined to that second terminal, if they (the messages or parts of them) were received by the other terminals. First terminals that can positively respond to that request, will convey the requested information when possible (e.g. if they are in an idle mode) along that secondary channel (i.e. the communication link that is not part of the communication network). The forwarding of the requested information from the first terminal(s) is done either by forwarding that information as messages (or parts of the messages), as received, or in a form of information derived from processing the requested messages (or parts thereof) by the first terminal before forwarding them towards the second terminal. Now, if the information is FEC input LLRs, the target terminal (the second terminal) adds LLRs from some or all collaborating terminals (the first terminals), corresponding to the very same bit or symbol. If the information is FEC output LLRs, the target terminal may add LLRs from some or all collaborating terminals, corresponding to the same bit or symbol. It also may perform additional FEC decoding iteration or any other combining algorithm that are known in the art per se.

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

The present invention has been described using detailed descriptions of embodiments thereof that are provided by way of example and are not intended to limit the scope of the invention in any way. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art. The scope of the invention is limited only by the following claims.

The invention claimed is:

1. A method for use in a communication network, utilizing available resources of at least one first terminal which belongs to a cluster comprising a plurality of terminals associated with said communication network, by at least one other terminal being a second terminal that belongs to said cluster of terminals, and wherein said utilization of idle resources is done by enabling communications between said first and second terminals to be carried out while using a communication link that is not part of said communication network, wherein the at least one second terminal is configured to aggregate information received from one or more other first terminals belonging to said cluster, while using at least one communication link that is not part of said communication network, wherein the at least one second terminal is configured to add LLRs from at least one of said one or more first terminals, that correspond to its bit or symbol, and wherein the aggregated information is selected from among a) FEC input LLRs, and b) FEC output LLRs.

2. A method for use in a communication network, utilizing available resources of at least one first terminal which belongs to a cluster comprising a plurality of terminals associated with said communication network, by at least one other terminal being a second terminal that belongs to said cluster of terminals, and wherein said utilization of idle resources is done by enabling communications between said first and second terminals to be carried out while using a communication link that is not part of said communication network, wherein the at least one second terminal is configured to aggregate information received from one or more other first terminals belonging to said cluster, while using at least one communication link that is not part of said communication network, and wherein the terminals that are associated with the cluster of terminals, belong to at least one network being a member of the group that consists of: a satellite communication network, a high altitude, long endurance (HALE) unmanned aircraft communication network, a cable network and a heterogeneous network (HetNet).

3. A method for use in a communication network, utilizing available resources of at least one first terminal which belongs to a cluster comprising a plurality of terminals associated with said communication network, by at least one other terminal being a second terminal that belongs to said cluster of terminals, and wherein said utilization of idle resources is done by enabling communications between said first and second terminals to be carried out while using a communication link that is not part of said communication network, wherein the at least one second terminal is configured to aggregate information received from one or more other first terminals belonging to said cluster, while using at least one communication link that is not part of said communication network, and wherein the terminals associated with the cluster of terminals are members of the group that consists of: Very Small Aperture satellite Terminals (VSAT), set top boxes used in satellite communication networks, set top boxes used in cables communication network, cellular phones, tablets, laptops, desktop computers, and smart television sets.

* * * * *